United States Patent [19]

Spencer et al.

[11] Patent Number: 5,023,067

[45] Date of Patent: * Jun. 11, 1991

[54] MANUFACTURING METHOD FOR CERAMICS AND PRODUCTS THEREOF

[75] Inventors: Nicholas D. Spencer, Washington, D.C.; Wie-Hin Pan; John A. Rudesill, both of Columbia, Md.

[73] Assignee: W. R. Grace & Co.-Conn., New York, N.Y.

[*] Notice: The portion of the term of this patent subsequent to Mar. 19, 2008 has been disclaimed.

[21] Appl. No.: 237,268

[22] Filed: Aug. 26, 1988

Related U.S. Application Data

[63] Continuation-in-part of Ser. No. 219,677, Jul. 15, 1988, abandoned, which is a continuation-in-part of Ser. No. 155,340, Feb. 12, 1988, which is a continuation-in-part of Ser. No. 95,083, Sep. 11, 1987, abandoned.

[51] Int. Cl.$^5$ .................................................. C01C 1/26
[52] U.S. Cl. .................................. 423/420; 423/430; 423/419 P; 505/738
[58] Field of Search .................. 505/1, 737, 738, 779, 505/780, 782, 785, 776, 777, 778; 264/65, 66; 423/419 R, 419 P, 420, 430

[56] References Cited

U.S. PATENT DOCUMENTS 4,839,339  6/1989  Bunker et al. ..................... 505/1

Primary Examiner—Mark L. Bell
Assistant Examiner—Chris Gallo
Attorney, Agent, or Firm—Wm. W. McDowell, Jr.; Edward J. Cabic; Steven Capella

[57] ABSTRACT

An extremely pure oxide containing two or more metals, homogeneous at the atomic level, is prepared by (1) reacting in water, soluble salts of two or more metals with quaternary ammonium carbonate; the metals being those that form water-insoluble carbonates, thereby to precipitate mixed carbonates of the metals; (2) recovering and drying the precipitate; (3) calcining the precipitate to provide an oxide of mixed metals homogeneous at the atomic level and substantially free from extraneous contaminants. The calcined oxide can be shaped and compressed as greenware and sintered to form useful ceramic products.

26 Claims, No Drawings

MANUFACTURING METHOD FOR CERAMICS AND PRODUCTS THEREOF

This application is a continuation-in-part of U.S. Ser. No. 219,677, filed July 15, 1988, now abandoned, which is a continuation-in-part of U.S. Ser. No. 155,340, filed Feb. 12, 1988, which is a continuation-in-part of U.S. Ser. No. 095,083, filed Sept. 11, 1987, now abandoned, all three of which applications are herein incorporated by reference in their entireties.

RELATED APPLICATIONS

All of the following are owned by the same assignee hereof.

Spencer and Cheng, U.S. Ser. No. 095,084, filed Sept. 11, 1987, directed to spray-drying solutions of salts of, e.g., Y, Ba, and Cu.

Jacob Block, U.S. Ser. No. 121,018, filed Nov. 16, 1987. Solution of trichloroacetates of, e.g., Y, Ba, and Cu heated to form mixed carbonates, filtered, dried, fired to oxide.

Dolhert, Rice and Block, U.S. Ser. No. 136,626, filed Dec. 22, 1987. $Y_2O_3$, $BaO_2$, and $CuO$ mixed, pelletized, and sintered.

Block and Dolhert, U.S. Ser. No. 188,926, filed May 2, 1988. Dried mixture of monocarboxylates of Ca, Ba, and Cu is calcined and the result heated with $Tl_2O_3$.

N. D. Spencer, U.S. Ser. No. 194,058, filed May 13, 1988, oxides of yttrium-alkaline earth-bismuth-copper.

Spencer and Dolhert, U.S. Ser. No. 201,988, filed June 3, 1984. Carbonates of Ca, Ba, and Cu are precipitated onto $Tl_2O_3$. Precipitate is recovered, dried, calcined, and sintered.

Jacob Block, U.S. Ser. No. 215,962, filed July 7, 1988. Oxide of Y, Ba, and Cu is made by spray drying a solution of the monocarboxylates, drying, and calcining.

U.S. Ser. No. 220,143, filed July 15, 1988, L. E. Dolhert, is directed to a laser cathode and method for making same, using a mixed oxide prepared by a process described herein.

SUMMARY OF THE INVENTION

An extremely pure mixture of two or more metal oxides, homogeneous at the atomic level, is prepared by (1) reacting in water, soluble salts of two or more metals with quaternary ammonium carbonate; the metals being those that form water-insoluble carbonates, thereto to precipitate mixed carbonates of the metals; (2) recovering and drying the precipitate; (3) calcining the precipitate to provide mixed metal oxides homogeneous at the atomic level and substantially free from extraneous contaminants.

Use of the quaternaries permits: i) facile pH control (essential for co-precipitation of various of the carbonates); ii) exclusion of additional metals, such as K in $K_2CO_3$ as used in prior carbonate processes; iii) ready burn-off of the carbonate source in the furnace; and iv) stoichiometric co-precipitation, without formation of interfering complexes or coordination compounds.

The metal oxides made in this invention are useful as ceramics, and certain mixes have specialty uses based on their extreme purity, durability, and electrical conductivity, e.g., superconductors, laser cathodes, electrodes in chlorine/caustic electrolysis, etc.

BACKGROUND OF THE INVENTION

It has long been known that the effective resistivity of certain metals was sometimes substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K.

Discovery of superconductivity in the system La-Ba-Cu-O (J. G. Bednorz and K. A. Muller, *Zeit. Phys.* B 64, 189–193 [1986]) has stimulated the search for other systems, particularly with a view to substituting other elements for the rare earths (RE) used in the earlier materials. For example, replacement of RE by Bi and Tl has been reported. See M. A. Subramanian et al., *Science*, 239, p. 1015 (1988); L. Gao et al., *Nature*, 332, pp. 623–624 (1988).

Michel, C., and Raveau, B., Oxygen intercalation in mixed valence copper oxides related to the perovskites, *Rev. de Chim. Minerale*, t. 21, pp. 407–425 (1984). This paper discloses and discusses certain oxides of La-(Ca or Sr or Ba)-Cu. It does not mention superconductivity.

European Patent Appln. 87100961.9, filed Jan. 23, 1987, published July 27, 1988 as 0 275 343. Bednorz, Mueller, and Takashige, "New Superconductive Compounds of the $K_2NiF_4$ Structural Type, etc." In an example, La-Ba-Cu nitrates are precipitated as oxalates, recovered, and calcined. The invention covers broadly oxide of rare earth-alkaline earth-transition metal. $T_c = 35°$ K.

Chu, C.-W., PCT Int. Pub. No. WO88/05029, published 14 July 1988. Int. Appln. No. PCT/US87/02958, filed 9 November 1987. Four U.S. priorities beginning with U.S. Ser. No. 2,089, 12 January 1987. Various oxide combinations are ground together (e.g., ball-milled), pressed into pellets, and sintered to make superconductors. Table I gives $T_c$'s of 91°–98° K. for eight 3-metal oxides, e.g., $YBa_2Cu_3$, $LaBa_2Cu_3$, etc.

Ihara, Hirabayashi, and Terada, PCT Int. Pub. No. WO88/05604, Int. Pub. date 28 July 1988; Int. Appln. No. PCT/JP88/00050, Int. filing date 25 January 1988; first of five priorities, Japan, 27 January 1987, 62/17013. A solution of nitrates of, e.g., Ba (or Sr), Y, and Cu is precipitated with oxalic acid. The precipitate is calcined, pressed, sintered, and annealed in oxygen. Alternately dry solid powders (oxide, carbonate, or nitrate) are mixed, pressed, and sintered. $T_c$ as high as 54° K.

Wu et al., Superconductivity at 93° K. in a New Mixed Phase Y-Ba-Cu-O Compound System at Ambient Pressure, Physical Review Letters, 58, 908–910 (2 March 1987) discloses making the title compounds by solid state reaction of $Y_2O_3$, $BaCO_3$, and $CuO$.

Engler et al., Superconductivity Above Liquid Nitrogen Temperature: Preparation and Properties of a Family of Perovskite-Based Superconductors, J. Am. Chem. Soc. 109, 2848–2849 (1987), mixes $Y_2O_3$, $BaCO_3$, and $CuO$ in a ball mill to give a 1:2:3 ratio of Y, Ba, Cu. The powder was heated in an alumina boat at 950° C., and the resulting black powder was reground and heated again.

Wang et al., Comparison of Carbonate, Citrate, and Oxalate Chemical Routes to the High-$T_c$ Metal Oxide Superconductors $La_{2-x}Sr_xCuO_4$, Inorg. Chem. 26, 1474–1476 (1987). This was the only reference we found using a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished material. If we wash repeatedly, we remove barium, a highly detrimental loss in our process.

Superconducting oxides of mixed metals including Tl are reported with a $T_c$ in excess of 100° K.

In preparing the system Tl-Ba-CuO, Z. Z. Sheng and A. M. Hermann "Superconductivity in the Rare Earth-Free Tl-Ba-Cu-O System Above Liquid Nitrogen Temperature," Nature, 332, pp. 55–58 (1988), first mixed and ground $BaCO_3$ and CuO to obtain a product which they heated, then intermittently reground to obtain a uniform black Ba-Cu-Oxide powder, which was then mixed with $Tl_2O_3$, ground, and heated, with formation of a superconducting material. It was noted that the Tl oxide partially melted and partially vaporized.

The superconductor system Tl-Ca-Ba-Cu-O was also reported in a paper by Sheng and Hermann, "Bulk Superconductivity at 120° K. in the Tl-Ca-Ba-Cu-O System," Nature, 332, pp. 138–139 (1988). The authors reported "stable and reproducible bulk superconductivity above 120° K. with zero resistance above 100° K." According to the paper the composition was prepared by mixing and grinding together $Tl_2O_3$, CaO and $BaCu_3O_4$. The ground mixture was pressed into a pellet and heated in flowing oxygen. The result was cooled and found to be superconducting.

See also the paper by Hazen et al., "100° K. Superconducting Phases in the Tl-Ca-Ba-Cu-O System," Phys. Rev. Lett., 60, pp. 1657–1660 (1988), which refers to two superconducting phases, $Tl_2Ca_2Ba_2Cu_3O_{10+}$ and $Tl_2Ca_1Ba_2Cu_2O_{8+}$, both with onset $T_c$ near 120° K. and zero resistivity at 100° K. Preparation included grinding together $Tl_2O_3$, CaO, and $BaCu_3O_4$ (or $Ba_2Cu_3O_5$), followed by heating.

And see "Nota Bene" in *High $T_c$ Update*, Vol. 2, No. 6, p. 1, Mar. 15, 1988, further re properties of the Tl-Ca-Ba-Cu-O system.

Oxides of La-Sr-Co as cathodes for $CO_2$ lasers are disclosed by N. Karube et al., "Sealed-off $CO_2$ lasers with $La_{1-x}Sr_xCoO_3$ oxide cathodes," Appl. Phys. Lett., 43, 1086 (1983); and N. Iehisa et al., "Performance Characteristics of sealed-off $CO_2$ laser with $La_{1-x}Sr_xCoO_3$ oxide cathode," J. Appl. Phys., 59, 317 (1986). However, the herein-described method of preparing such materials is believed novel.

Salutsky et al., J. Am. Chem. Soc. 72, 3306–3307 (1950); and Quill et al., Anal. Chem. 24, 1453 (1952) disclose precipitation of metal carbonates by heating aqueous solutions of the metal chloroacetates.

Kirk-Othmer, *Ency. of Chemical Techn.*, 4, 843, 2nd Ed. (1964), discusses rare earth sources and describes didymium as a rare earth mixture that excludes Ce and Th.

British nomenclature appears to be somewhat different, in that didymium excludes lanthanum. According to British writer, R. J. Callow, *The Rare Earth Industry*, p. 46, Pergamon Press (1966), removal of cerium from a rare earth mixture leaves " . . . mainly lanthanum and didymium. In American practice it is called didymium at this stage." (We follow the American definition. See infra.).

From the technical viewpoint it may seem obvious that co-precipitated carbonates would provide enhanced homogeneity. However, the technical solution to the problem proved frustrating and was marked by an initial series of failures. We noted that the Wang et al. process, using potassium carbonate (or sodium carbonate) necessitated numerous washings and apparently left detectable amounts of alkali in the ceramic base even so. As noted, serial washings remove Ba, and would be unworkable in our process. Nor is it merely sufficient that the carbonate be derived from a cation that would burn off completely. For example, ammonium carbonate does not work, because a pH below 7 is required to prevent formation of copper tetraamine, but under these conditions bicarbonate ion is formed, with consequent formation of barium bicarbonate, which, being slightly soluble, disrupts the desired stoichiometry. Quaternary ammonium carbonates, on the other hand, form the desired metal carbonates simply and cleanly without troublesome side-formation of complexes or coordination compounds, with firm and precise retention of the intended stoichiometry; which do not interfere with filtration, or similar recovery operations; which do not introduce contaminants into the final product; and which result in homogeneous particles that do not require grinding. The reaction in the reaction mixture is, of course, ionic; that is, carbonate ions react with the respective metal ions to form the respective metal carbonate precipitate.

A composition having an approximate unit cell formula of $YBa_2Cu_3O_z$, where z is typically about 7, and various related materials, represents a particularly promising group of ceramics for superconducting applications. The compositions are typically formulated from precursors which can be mixed to provide the desired ceramic. In one formulation for these ceramic materials (see, e.g., Wu, Engler, Chu, opera cit) carbonate and/or oxide powders of the solid elements are mixed and raised to a temperature of about 1,000° C., driving off volatile materials, such as carbon dioxide. The mixture is reground and reheated, ordinarily several times to improve the intimacy of the mixture, and then can be pelletized, sintered for several hours, and then gradually cooled to below 250° C. This repeated regrinding tends to introduce impurities, as hereinafter discussed.

"L.M.A.D." NOMENCLATURE

The literature from time to time has defined superconductor oxides where L, M, and A are three different metals and D is oxygen. We may adopt this nomenclature passim, especially in instances where the description or claim appears to include an oxide with superconducting properties.

Thus, employing this terminology, L may be at least one trivalent metal (i.e., valence of +3) such as yttrium or bismuth, and is suitably selected from yttrium, bismuth, scandium, and the rare earth group elements (elements with atomic numbers 57–71). M may be at least one bivalent metal (i.e., valence of +2) such as Ba or Sr, and is suitably selected from the group Ba, Be, Mg, Ca, and Sr; and A is at least one metal of multiple valency (i.e., more than one valence state) such as Cu or Nb, and is suitably selected from the group Cu, Ag, and Au.

A good combination is Y, Ba, and Cu in an atomic ratio of 1:2:3. (Example 1.) This results in an amount of oxygen in the calcined product equal to about 7 (or a little less) atoms per atom of Y.

DETAILED DESCRIPTION OF THE INVENTION

Solution A, the Carbonate Reagent

A solution of quaternary ammonium carbonate is conveniently prepared by bubbling $CO_2$ through an aqueous solution of a quaternary ammonium hydroxide until the quaternary carbonate is stoichiometrically formed and $CO_2$ is dissolved in excess. The quaternary ammonium hydroxide has the formula:

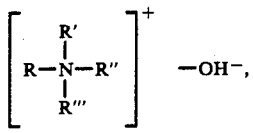

where R, R', R" R'" are the same or different members of the group:
 i) alkyl, e.g., tetramethylammonium hydroxide, tetraethylammonium hydroxide, tetrapropylammonium hydroxide, dimethyldiethylammonium hydroxide, cyclopropyltrimethylammonium hydroxide and the like;
 ii) aromatic, e.g., phenyltrimethylammonium hydroxide, phenylethyldimethylammonium hydroxide, benzyltrimethylammonium hydroxide, and the like;
 iii) heterocyclic;
 iv) and any two group members may be joined in a ring whereby N becomes a ring member, e.g., dimethyl pyrrolidinium hydroxide, dimethylpyridinium hydroxide, and the like.

The Metals

The invention process is a general one and is applicable to any metals (a) that provide water-soluble salts (nitrates, acetates, etc.) and (b) which form water-insoluble carbonates. The carbonates in various instances are actually the basic carbonates, subcarbonates, etc. It makes no difference, the important thing being water-insolubility. Here again it should be borne in mind that all carbonates are to some extent water-soluble. Those that are difficultly soluble are intended for use in this invention, e.g., those having solubilities roughly comparable to the carbonates of the alkaline earth metals.

Some of the preferred metals (that have insoluble carbonates, as the term is used herein) are:
(1) The rare earths, i.e., elements with atomic numbers 57-71 inclusive.
(2) Alkaline earth metals (be, Mg, Ca, Sr, Ba).
(3) Cu, Ag, Au.
(4) Mn, Fe, Co, Ni.
(5) Zn, Cd, Hg.
(6) Pb, Bi.
(7) Sc, Y.
(8) Zr.

Solution B, the Metal Salts

An aqueous solution of metal salts is made up by dissolving their nitrates or other water-soluble salts in water. The anions should be those readily volatilized on calcination. The metal atomic ratios will depend on the end use intended. Typically, any given metal may be present in an atomic ratio of 1-100, suitably 1-10, with respect to any other metal. However, when it is desired to introduce very small amounts of a given metal, this ratio will vary accordingly.

The Co-carbonate Slurry

Solutions A and B are now added slowly, simultaneously, at constant rates, with stirring, to a pool ("heel") of deionized water. This pool is the reaction medium for the carbonate co-precipitation reaction, and the eventual result is a carbonate slurry. Solutions A and B and the heel are suitably each about the same starting volume. The pH of the reaction mass is suitably maintained at about 7.7-10.0 by drip-wise addition of a quaternary ammonium hydroxide. The precipitated carbonates can be recovered from the slurry using various techniques. On a laboratory scale simple filtration followed by air drying the precipitate is adequate for good homogeneity.

The co-carbonate slurry comprises:
i) precipitated carbonates, about 0.5-75 wt. %;
ii) quaternary ammonium cations, about 0.1-75 wt. %;
iii) anions residual from the starting metal salts, stoichiometrically equivalent to the metal carbonates; and
iv) balance, water.

This novel carbonate-containing slurry is per se an essential part of the invention.

The following examples illustrate without limiting the invention.

EXAMPLE 1

Preparation of Oxide of $YBa_2Cu_3$

Carbon dioxide (from dry ice) was bubbled through 0.405 moles of 40 wt. % tetraethylammonium (TEA) hydroxide until the pH was 8.3 to form $TEA_2CO_3$ and/or $TEAHCO_3$. The solution was diluted to 250 cc. 0.016 moles yttrium nitrate, 0.032 moles barium nitrate, and 0.048 moles copper nitrate were dissolved in deionized water to make 250 cc solution. The two solutions were slowly dripped into a heel of 300 cc deionized water with stirring. The pH was maintained at about 7.7-8.0 by the dropwise addition of a solution of TEAOH (40 wt. %). The TEAOH solution had a pH of 14-15. The light blue precipitate was filtered, then dried at 110° C. overnight and fired in flowing air. The firing program involved a ramp to 950° C. overnight and fired in flowing air. The firing program involved a ramp to 950° C. over 6 hours, maintaining 950° C. for 6 hours, then linearly cooling to 150° C. over 8 hours. The resulting black solid, when compressed (18000 lbf, ⅜"-diameter die) into a wafer, could levitate a magnet at liquid nitrogen temperatures. Other products have been made on a larger scale using tetramethyl ammonium hydroxide (TMA) as the quaternary ammonium compound and cooling under oxygen following calcination in air at about 920° C.

$\Delta T_c$

The superconducting ceramic product of Example 1, oxide of $YBa_2Cu_3$, shows a relatively narrow $\Delta T_c$, indicating a high degree of purity and homogeneity. By "Delta $T_c$" we mean the width of the resistivity curve as it leaves the zero resistivity line at some particular temperature, $T_c$ rises (generally sharply) with rising temperature (indicating increasing resistivity and loss of superconductivity) and then levels off asymptotically at another particular temperature, indicating complete or substantially complete loss of superconductivity and entry of the ceramic into the world of normal resistance/conductivity.

Levitation Test for Superconductivity

Various tests are available for the determination of superconductivity. One of these tests is conventional, simple, and is accepted in the art as definitive for $T_c$'s of 77° K. and higher. We used this, the so-called levitation test, for the product of Example 1, and we describe it below.

A circular wafer of the compound is prepared by calcining and compressing as described in Example 1. The wafer is about 1" in diameter and about 3/16" thick. It is placed in the center of a glass dish, and then liquid nitrogen (77° K.) is poured into the dish.

The wafer bubbles a bit at first, as the nitrogen boils on contact, and as surface air is flushed from the wafer. In a few minutes gas evolution diminishes to nearly zero, and the wafer may be assumed to be chilled to approximately the temperature of liquid nitrogen. A chip of a rare earth magnet is now dropped gently over the wafer. If the magnet levitates, i.e., hovers in the air over the wafer (the Meissner effect), the wafer is superconducting. (Comment: Instances have been reported where the magnet sank; yet measurable superconductivity existed and was detectable by more sophisticated means, e.g., magnetic susceptibility, in Example 3.)

Calcination

Starting with the direct carbonate precipitate, we have found that the following Calcination Program is useful for products like those of Example 1:

1) The precipitate is placed in an alumina boat, which is then placed in an electric furnace in flowing air.

2) The furnace is brought up to about 600° C. to 1400° C., the precise calcining temperature range depending upon the metal composition. Generally, the preferred temperature range is from about 850°–1050° C., suitably 950° C. The time required to bring the furnace up to temperature is not critical. At least a few minutes is, however, generally necessary, depending on the structure and operation of the furnace.

3) The furnace is maintained at the temperature selected in 2) for about 4–8 hours, suitably about 6 hours.

4) Next, the furnace is gradually cooled over a period of time (linear cooling). We prefer to cool down to about room temperature to 250° C. over 5–12 hours, suitably 8 hours. Cooling is preferably accomplished in an atmosphere of $O_2$ (Comment: At this stage the calcined product—a powder—is superconducting. To facilitate the levitation or other test, it may be compressed into a wafer.)

We have found that a useful organic-free intermediate can be prepared by heating the dried co-precipitate recovered from the co-carbonate slurry to a temperature sufficient to decompose or otherwise volatilize any remaining quaternary ammonium and anion material (e.g., nitrate) and to achieve partial conversion of the carbonates in the co-precipitate to oxides. For example, an yttrium-barium-copper co-precipitate from nitrate salts may be heated to about 540° C. to remove quaternary ammonium and nitrate material and to convert yttrium and copper carbonates to their respective oxides. These intermediates are generally powders which can be conveniently stored, shipped, or processed and can be easily transformed to superconductors by the calcination procedure as described above.

EXAMPLE 2

Preparation of $La_{0.7}Sr_{0.3}CoO_3$ 116.20 g $La(NO_3)_3.5 H_2O$
25.50 g $Sr(NO_3)_2$
116.40 g $Co(NO_3)_2.6 H_2O$ The above nitrates were placed in a 1-L beaker. Deionized water was added to make an 800-ml solution. 800 ml, pH 10.00 tetramethylammonium carbonate, produced by bubbling $CO_2$ into 25 wt. % aqueous tetramethylammonium hydroxide, was placed in a separate 1-L beaker. An 800 ml deionized water "heel" was placed in a 4-L beaker. pH of the 3-metal nitrate solution was 3.90. Simultaneously, the nitrate solution and the tetraethylammonium carbonate solution were dripped into the heel, keeping the heel pH at about 9 using neat tetramethylammonium hydroxide, which was dripped separately into the heel from a 500 ml burette. About 30 minutes was required to add the two reactant solutions to the heel. An extra 335 mls neat tetramethylammonium hydroxide were added to keep the pH at 9.01. The solution was allowed to "age" by stirring for twenty minutes, to aid subsequent filtration. The resulting purple solution was filtered through double-thickness filter paper with a Buechner funnel. Filtration proceeded overnight. The semi-dry cake was placed in a glass tray, which was placed in a 100° C. convection oven where it was allowed to dry. Weight of purple cake, 185.02 g. The cake pieces were broken up with mortar and pestle. 46.00 g of the resulting powder was placed in a platinum crucible and calcined in air, as follows: 8 hours to 900° C.; 8 hours at 900° C.; then power off, and allowed to cool to room temperature. The resulting powder, $La_{0.7}Sr_{0.3}CoO_3$, was determined by x-ray diffraction to be homogeneous at the atomic level and phase pure.

Extraneous Materials

Prior art processes conventionally enhance homogeneity by grinding the calcined mixed oxides, followed by recalcining. In some instances this sequence may be repeated several times. The problem here is that effective grinding inevitably and inherently introduces trace impurities into the ceramic, simply by impacting the ceramic between the balls and walls (or other grinding surfaces) of the grinding mill. It is known, for example, that silica or stainless steel balls in a ball mill lose significant mass over a period of use. This mass of course disappears into whatever is being milled. Mills that comminute by particle self-impact lose metal by wall-scouring, particularly in the area of steam entry.

Thus, the firing-grinding-refiring technique rapidly achieves a balance: improvement in homogeneity tends to be matched by contamination build-up that cancels part or all of the improvement.

The process of this invention, by achieving ultimate homogeneity in the first place, avoids the grinding problem altogether. The oxide product can, of course, be subjected to the conventional firing-grinding-refiring cycle, but this is not preferred. The process works best when no extraneous materials are introduced into the material at any stage. By "extraneous materials" is meant materials introduced into the base metal solution to precipitate the carbonates, e.g., potassium carbonate to precipitate the invention carbonates. The term also includes contaminants (generally metals or metal oxides) introduced into the composition by grinding mixed oxides. If the product is ground in a ball mill using quartz or silica balls, some of the impurity is silica.

The extreme purity and homogeneity of the mixed oxide powders of the invention qualify the powders for a specialty uses. Particularly useful products can be prepared by compressing the powders into greenware ceramic shapes, suitably followed by sintering. Such compression may be extrusion, compression in a pellet mold, etc. Where extreme pressures are desired, uniformly applied (especially for intricate shapes), cold isostatic pressing ("c-i-p") is eminently useful. This technique is well-known.

Laser Cathode

A low-resistance cathode tube for a $CO_2$ laser was prepared by placing 40 g of the calcined powder ($La_{0.7}Sr_{0.3}Co$ oxide) from Example 2 into a rubber mold, which was then cold-isostatically pressed at 20,000 psi. In determining dimensions of the mold, the final dimensions desired, as affected by shrinking in the c-i-p and subsequent sintering operations, had to be taken into account. The greenware shrinks about 15% linearly during c-i-p and another 22% (approximate) during sintering. Overall shrinkage in this particular instance is thus about $(1-0.15) \times (1-0.22) = 0.66$, so mold dimensions are suitably $1/0.66 \times$ final compacted and sintered dimensions, i.e., about $1.5\times$. This factor may vary somewhat depending on compaction pressure, sintering schedule, powder composition, etc. In this case the final dimensions of the cathode tube were about 1" long by ¼" diameter, with tube walls about ⅛" thick.

Following c-i-p, the greenware was placed on a support bed of alumina grit in an alumina boat, which was placed in a furnace, and the greenware was sintered in air per the following schedule (all °C.): 3 hours from room temperature to 1050°; 6 hours at 1050°, ½ hour to 1150°, then 6 hours at 1150°, then ½ hour to 575°, then power off and allow to cool to room temperature.

Rare Earth Mixtures (Didymium)

It is not necessary that only one rare earth (e.g., La alone) be used in making the oxide compound. Mixtures of two or more rare earths can be used, e.g., as the nitrates, acetates or other water-soluble salts. (As already noted, the salt form should be selected such that the anion is readily decomposed and volatilized in the calcining or firing step.)

A particularly useful mixture of rare earths is the material known in the art as didymium. Originally didymium ("Di") was thought to be an element, but it was ultimately separated into neodymium and praeseodymium by Auer von Welsbach. Today, the term means something quite different: it refers to a mixture of rare earths from which at least some of the cerium and/or lanthanum has been extracted, the other rare earths remaining in their natural state of abundance. We use the modern definition.

A common source of rare earth mixtures is monazite sands (an orthophosphate of thorium and rare earths), which may analyze typically $CeO_2$, 30%; other rare earth oxides, 32%; $ThO_2$, 6.5%; $P_2O_5$, 29%; and $SiO_2$ 1.5%. Another source of rare earths is bastnasite, a rare earth fluocarbonate. Both ores contain all the rare earths, though in differing amounts.

Monazite ore is conventionally treated first to remove thorium and at least some of the cerium. Ce removal may amount to 50% or more, depending on the process. Residual Ce may thus be present in an amount ranging from negligible to about 50%. As noted, rare earths remaining, including any residual Ce, are referred to as "Di," or "$Di_2O_3$."

A quantitative analysis of Di is extremely difficult, even with modern methods. Europium, for example (not one of the rarest earths) occurs to the extent of only about 0.0002% in monazite sand. Some of the rare earths can be detected only spectroscopically. The Di nitrates used in Example 3 were derived from Ce- and Th-extracted monazite residues as will now be described. These residues are considered to contain every one of the rare earths, though some may have been present in very small amounts.

In calculating moles of Di nitrate for use in Example 3, we added each metal oxide separately in the above analysis, and recalculated to the nitrate. For example, in a hypothetical 100 g sample of oxides, 1.23 g $CeO_2 = 1.23/172 = 0.00715$ moles $Ce(NO_3)_4$; 46.26 g $La_2O_3 = (46.26 \times 2)/326 = 0.142$ moles $La(NO_3)_3$, and so on. After the total number of moles of nitrates is determined (0.60734 in this particular analysis), the predetermined amount of Di reactant as oxide, carbonate, or nitrate can be determined by pro-rating the components. For example, if 0.05 moles of Di nitrate is used, as in Example 3, the amount of $Ce(NO_3)_4$ therein is $(0.00715 \times 0.05)/0.60734 = 0.0005886$ moles. Similarly the amount of $La(NO_3)_3$ would be $(0.284 \times 0.05)/0.60734 = 0.02338$ moles. The moles of each nitrate may be converted to grams and the aggregate will represent the total weight in grams of Di nitrate equivalent to 0.05 moles. The weights may vary depending on the ore source and the respective analyses. In this particular case 0.60734 moles of nitrates was equivalent to 198.01 g Di nitrates; thus 0.05 moles Di nitrate $= (0.05 \times 198.01)/0.60734 = 16.3$ g Di nitrate. In this instance Di has an artificial atomic weight of approximately $(198.01/0.60734 - 186 = 140$. Atomic weights of the rare earths range between 138.9 (La) and 175 (Lu). The value of 140 for Di is in the lower range because of its high content of lanthanum. We emphasize that Di does not have a true atomic weight, but rather 140 represents an average of all the rare earths ($+Y$) comprising Di. This definition is intended throughout the specification and claims. Thus, when an atomic ratio involving Di is stated, Di means a rare earth mixture as above defined, with an artificial atomic weight which is typically 140, but may vary somewhat depending on composition.

Preparation of Didymium Nitrate

We start with rare earth chloride (ReCl) solution from monazite attack, remaining after conventional thorium separation. This liquor carries the original natural rare earth distribution. To this we add base and oxidizer to precipitate most of the Ce as $Ce(OH)_4$, which is recovered, leaving Ce-depleted/La-rich ReCl plus base. Soda Ash is added to this solution to precipitate La-rich $Re_2(CO_3)_3$, which is recovered and purified, and is then reacted with nitric acid to give a solution of didymium nitrate rich in La. This solution is used in Example 3. Analysis as oxides is:

|                                 | wt. %  |
| ------------------------------- | ------ |
| $CeO_2$                         | 1.23   |
| $La_2O_3$                       | 46.26  |
| $Nd_2O_3$                       | 32.32  |
| $Pr_6O_{11}$                    | 8.95   |
| $Sm_2O_3$                       | 4.37   |
| $Y_2O_3$                        | 2.74   |
| $Gd_2O_3$                       | 2.61   |
| $Dy_2O_3$                       | 0.86   |
| $Tb_4O_7$                       | 0.20   |
| $Er_2O_3$                       | 0.16   |
| $Ho_2O_3$                       | 0.10   |
| $Eu_2O_3$                       | 0.12   |
| $Tm_2O_3$                       | 0.02   |
| $Yb_2O_3$                       | 0.05   |
| $Lu_2O_3$                       | 0.00   |

EXAMPLE 3

Preparation of $DiBa_2Cu_3O_7$

The procedure of Example 1 was followed, except as noted. We used the following nitrate mixture:
Di nitrate, 0.05 moles.
Ba nitrate, 0.10 moles.
Cu nitrate, 0.15 moles.

The quaternary carbonate used was tetramethylammonium carbonate (TMA carbonate).

The resulting precipitate (mixed carbonate of $DiBa_2Cu_3$) was dried and fired at 435° C. to at least partially convert the carbonates to oxides, to produce a precursor powder, which was further fired in a controlled atmosphere, as follows:

Schedule A

Calcination at 975° C.

(All steps in electric furnace, with oxygen.)
(1) Heat from room temperature to about 975° C. in about 6 hours.
(2) Hold at about 975° C. for about 10 hours.
(3) Cool to about 650° C. in about 3 hours.
(4) Cool from about 650° C. to about 250° C. in about 8 hours, and then
(5) Power off.

The resulting ceramic was determined to be superconducting by magnetic susceptibility and resistant measurements. The $T_c$ was found to be 30° K.

In a further experiment we pelletized the material and reheated at a higher temperature some of the product of the above sintering operation to see whether this would increase the $T_c$. We found no effect. This higher temperature schedule was:

Schedule B

Sintering at 1050° C.

(All steps in electric furnace, in oxygen.)
(1) From room temperature to about 1050° C. in about 2 hours.
(2) Hold at about 1050° C. for about 10 hours.
(3) Cool to about 300° C. in about 3 hours.
(4) Hold at about 300° C. for about 20 hours, then
(5) Power off.

The two sintering Schedules A and B above are applicable to all the co-precipitated products of our invention.

The invention process (as exemplified, e.g., in Example 3) can be used to make a series of novel Di oxide compounds by substitution of other metals for Ba and Cu, viz.:
(a) oxide of L.M.A where L is Di and M and A are different metals that provide water-soluble salts (nitrates, acetates, etc.) with heat-decomposable anions and that form water-insoluble carbonates.
(b) oxide of L.M.A where L is Di, M is at least one bivalent metal, and A is at least one metal of multiple valency.
(c) oxide of L.M.A where L is Di, M is Ba, and A is Cu, suitably in the respective atomic ratio of 1:2:3.

EXAMPLE 4

Preparation of $La_{0.6}Nd_{0.4}Ba_2Cu_3O_7$

The process of Example 1 was followed except that the following mixture of nitrates was used:

| $La(NO_3)_3$ | 0.6 moles |
| $Nd(NO_3)_3$ | 0.4 moles |
| $Ba(NO_3)_2$ | 2 moles   |
| $Cu(NO_3)_2$ | 3 moles   |

The carbonate co-precipitate was filtered, dried (110° C.), heated (540° C. in air), then calcined and sintered according to Schedule A followed by Schedule B in Example 3. $T_c$ resulting from Schedule A (975° C.) was 47° K., and Schedule A followed by Schedule B (1050° C.) was 90° K., both by magnetic susceptibility measurements.

EXAMPLE 5

Preparation of $La_{0.54}Nd_{0.35}Pr_{0.11}Ba_2Cu_3O_7$

The carbonate precipitation procedure of Example 1 was used with the two sintering programs of Example 3 (Schedule A, then Schedule B).

The nitrate solution consisted of:

| $La(NO_3)_3$ | 0.54 moles |
| $Nd(NO_3)_3$ | 0.35 moles |
| $Pr(NO_3)_3$ | 0.11 moles |
| $Ba(NO_3)_2$ | 2 moles    |
| $Cu(NO_3)_2$ | 3 moles    |

The product was found to have a $T_c$ of 30° K. by calcining with Schedule A; this was not increased by further sintering with Schedule B.

EXAMPLE 6

Preparation of $LaBa_2Cu_3O$

The carbonate precipitation of Example 1 was followed, and the precipitate was heated and sintered by the two-step calcining and sintering procedure of Example 3 (Schedule A, followed by Schedule B). The respective nitrates were used in amounts to provide an La:Ba:Cu atomic ratio of 1:2:3. Magnetic susceptibility tests showed a $T_c$ of 30° K. following Schedule A and 80° K. following Schedule B.

Referring back to the two sintering operations in Example 3, we have observed that Schedule A (at 975° C.) does indeed result in superconducting properties for the products of Examples 1 and 3–6, but that the $T_c$'s are generally lower than in the case when Schedule B (1050° C.) is used, either by itself or following a Schedule A. Thus:

| Example | Sinter at 975° C. only $T_c$ | Sinter at 975° C., then at 1050° C. $T_c$ |
|---|---|---|
| 3 - (Di) | 30 | 30 |
| 4 - (La—Nd) | 47 | 90 |
| 5 - (La—Nd—Pr) | 30 | 30 |
| 6 - (La) | 30 | 80 |

What is claimed is:

1. Aqueous slurry consisting essentially of a homogeneous dispersion of a co-precipitate of at least two metal carbonates and quaternary ammonium salts.

2. Slurry according to claim 1 wherein at least one of the metal carbonates is a carbonate of a metal of the group: the rare earths; the alkaline earths; Cu and Ag; Mn, Fe, Co, and Ni; Zn, Cd, and Hg; Pb and Bi; and Sc, Y, and Zr.

3. Slurry according to claim 2 wherein the carbonates are of Y, Ba, and Cu, in a respective atomic ratio of about 1:2:3.

4. Slurry according to claim 2 wherein the carbonates are of La, Sr, and Co, in a respective atomic ratio of about 0.7:0.3:1.

5. Slurry according to claim 2 wherein the carbonates are of Di, Ba, and Cu in a respective atomic ratio of about 1:2:3.

6. Slurry according to claim 2 wherein the carbonates are of La, Ba, and Cu, in the respective atomic ratio of about 1:2:3.

7. Slurry according to claim 2 wherein the carbonates are of La, Nd, Ba, and Cu in a respective atomic ratio of about 0.6:0.4:2:3.

8. Slurry according to claim 2 wherein the carbonates are of La, Nd, Pr, Ba, and Cu in a respective atomic ratio of about 0.54:0.35:0.11:2:3.

9. Aqueous slurry consisting essentially of homogeneous dispersion of L.M.A carbonates and quaternary ammonium salts, where L is at least one trivalent metal, M is at least one bivalent metal, and A is at least one metal of multiple valency.

10. Aqueous slurry according to claim 9 consisting essentially of:
(a) L.M.A. carbonates, about 0.5-75 wt %;
(b) quaternary ammonium cations, about 0.1-75 wt %;
(c) anions residual from the starting L.M.A salts, stoichiometrically equivalent to the L.M.A carbonates; and
(d) balance, water.

11. Process comprising reacting in aqueous medium at a pH of about 7.7-10.0, carbonate ions from quaternary ammonium carbonate with ions of at least two metals that form water-insoluble carbonates, thereby to form a slurry comprising co-precipitates of the respective metal carbonates, homogeneous at the atomic level, and substantially free of extraneous materials.

12. Process according to claim 11 wherein at least one of the metals is of the group: the rare earths, the alkaline earths; Cu and Ag; Mn, Fe, Co, and Ni; Zn, Cd, and Hg; Pb and Bi; and Sc, Y, and Zr.

13. Process according to claim 12 wherein the metals are Y, Ba, and Cu in the respective atomic ratio 1:2:3.

14. Process according to claim 12 wherein the metals are La, Sr, and Co in the respective atomic ratio 0.7:0.3:1.

15. Process according to claim 12 wherein the metals are Di, Ba, and Cu in the respective atomic ratio 1:2:3.

16. Process according to claim 12 wherein the metals are La, Ba, and Cu in the respective atomic ratio 1:2:3.

17. Process according to claim 12 wherein the metals are La, Nd, Ba, and Cu in the respective atomic ratio 0.6:0.4:2:3.

18. Process according to claim 12 wherein the metals are La, Nd, Pr, Ba, and Cu in the respective atomic ratio 0.54:0.35:0.11:2:3.

19. Process comprising reacting in aqueous medium, carbonate ions from quaternary ammonium carbonate, with L.M.A metal ions and anions thereby to form a slurry comprising precipitates of the respective metal carbonates, and recovering and drying the precipitates; the precipitate is heated to a temperature sufficient to decompose or otherwise volatilize any remaining quaternary ammonium and anions and to achieve partial conversion of carbonates in the co-precipitate to oxides; L being at least one trivalent metal, M being at least one bivalent metal, and A being at least one metal of multiple valency; and L, M, and A being present in a predetermined atomic ratio for a superconductor.

20. Process according to claim 19 wherein, following heating the precipitate, the precipitate is calcined to an initial temperature of about 850°-1050° C.; held at that temperature for about 4-8 hours; and linearly cooled down to a temperature in the range of about room temperature to 250° C. over about 5-12 hours, thereby forming a superconducting material.

21. Process according to claim 11 wherein carbon dioxide is passed through aqueous tetraalkylammonium hydroxide to a pH of 8.3 to form tetraalkylammonium carbonate plus dissolved carbon dioxide; adding the said tetraalkylammonium carbonate to an aqueous solution of nitrates of yttrium, barium, and copper in a Y:Ba:Cu atomic ratio of 1:2:3 at a pH of about 7.7-8.0, thereby to precipitate the said Y, Ba, and Cu as carbonates; recovering and drying the precipitate; calcining the dried precipitate at about 950° C. and cooling the calcined product to about 150° C. over 8 hours; said tetraalkylammonium being tetramethylammonium or tetraethylammonium.

22. Process according to claim 11 wherein the metal ions are derived from metal nitrates.

23. Process according to claim 11 wherein the quaternary ammonium carbonate is prepared by bubbling $CO_2$, through an aqueous solution of a quaternary ammonium hydroxide until the quaternary carbonate is stoichiometrically formed and $CO_2$ is dissolved in excess, said quaternary ammonium hydroxide having the formula:

$$\left[ \begin{array}{c} R' \\ | \\ R-N-R'' \\ | \\ R''' \end{array} \right]^+ \quad -OH^-,$$

where R, R', R" R''' are the same or different members of the group:
i) alkyl, tetramethylammonium hydroxide, tetraethylammonium hydroxide, tetrapropylammonium hydroxide, dimethyldiethylammonium hydroxide, and cyclopropyltrimethylammonium hydroxide;
ii) aromatic, phenyltrimethylammonium hydroxide, phenylethyldimethylammonium hydroxide, and benzyltrimethylammonium hydroxide;

iii) heterocyclic;

iv) and any two group members may be joined in a ring whereby N becomes a ring member, dimethyl pyrrolidinium hydroxide, and dimethylpyridinium hydroxide.

24. Process according to claim 23 wherein L.M.A is $Y.Ba_2Cu_3$, $La_{0.7}Sr_{0.3}Co$, $Di.Ba_2Cu_3$, $LaBa_2Cu_3$, $La_{0.6}Nd_{0.4}Ba_2Cu_3$, or $La_{0.54}Nd_{0.35}Pr_{0.11}Ba_2Cu_3$ and quaternary ammonium carbonate is tetramethylammonium carbonate or tetraethylammonium carbonate.

25. Process, calcining in oxygen a mixture of co-precipitated metal carbonates which has been heated to convert the carbonates at least partially to oxide, said calcining proceeding in accordance with the following schedule:

(1) Heat to about 975° C. in about 6 hours;
(2) Hold at about 975° C. for about 10 hours;
(3) Cool to about 650° C. in about 3 hours;
(4) Cool from about 650° C. to about 250° C. in about 8 hours; and then
(5) Discontinue heating.

26. Process according to claim 25, wherein, following completion of the stated schedule, the product is further heated in oxygen according to the following schedule:

(1) Heat from room temperature to about 1050° C. in about 6 hours;
(2) Hold at about 1050° C. for about 10 hours;
(3) Cool to about 300° C. in about 4 hours;
(4) Hold at about 300° C. for about 20 hours; then
(5) Discontinue heating.

* * * * *